US009484888B2

(12) United States Patent
Yang et al.

(10) Patent No.: US 9,484,888 B2
(45) Date of Patent: Nov. 1, 2016

(54) LINEAR RESISTOR WITH HIGH RESOLUTION AND BANDWIDTH

(71) Applicant: Intel Corporation, Santa Clara, CA (US)

(72) Inventors: Yong Yang, Portland, OR (US); Zuoguo Wu, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 67 days.

(21) Appl. No.: 13/719,527

(22) Filed: Dec. 19, 2012

(65) Prior Publication Data

US 2014/0167821 A1 Jun. 19, 2014

(51) Int. Cl.
H03K 3/00 (2006.01)
H03H 11/24 (2006.01)
H03F 3/45 (2006.01)

(52) U.S. Cl.
CPC ........ *H03H 11/245* (2013.01); *H03F 3/45197* (2013.01)

(58) Field of Classification Search
USPC ........................................................ 327/108
See application file for complete search history.

(56) References Cited

U.S. PATENT DOCUMENTS

| | | | | |
|---|---|---|---|---|
| 5,563,540 | A * | 10/1996 | Ashley et al. | 327/379 |
| 8,436,642 | B1 * | 5/2013 | Kireev et al. | 326/30 |
| 2005/0232010 | A1 | 10/2005 | Cernea | |
| 2006/0028262 | A1 * | 2/2006 | Grimone, III | 327/427 |
| 2006/0091932 | A1 * | 5/2006 | Farjad-rad | 327/427 |
| 2009/0027089 | A1 * | 1/2009 | Hebenstreit | H03K 19/01852 327/108 |
| 2009/0116307 | A1 | 5/2009 | Cottier et al. | |
| 2009/0315624 | A1 * | 12/2009 | Chow et al. | 330/291 |
| 2011/0075491 | A1 | 3/2011 | Yun et al. | |
| 2013/0057320 | A1 * | 3/2013 | Liu et al. | 327/108 |

OTHER PUBLICATIONS

Notification of Transmittal of the International Search Report and the Written Opinion of the International Searching Authority issued for International Patent Application No. PCT/US2012/071714, mailed Sep. 12, 2013.
Garcia, Jose C., et al., "High Performance Bootstrapped CMOS Low to High-Swing Level-Converter for On-Chip Interconnects," *18th European Conference on Circuit Theory and Design*, pp. 795-798, 2007.
Shrivastava, Aatmesh, et al., "A Charge Pump Based Receiver Circuit for Voltage Scaled Interconnect," *International Symposium on Low Power Electronics and Design*, pp. 327-332, 2012.
Zhang, Hui, et al., "Low-Swing On-Chip Signaling Techniques: Effectiveness and Robustness," *IEEE Transactions on Very Large Scale Integration (VLSI) Systems*, vol. 8, No. 3, pp. 264-272, Jun. 2000.

* cited by examiner

*Primary Examiner* — Lincoln Donovan
*Assistant Examiner* — Patrick Chen
(74) *Attorney, Agent, or Firm* — Blakely, Sokoloff, Taylor & Zafman LLP (57) ABSTRACT

Described is an apparatus which comprises: a first voltage follower; a second voltage follower; and a pass-gate including a p-type transistor in parallel to an n-type transistor, wherein gate terminal of the p-type transistor is controlled by an output of the first voltage follower, and wherein gate terminal of the n-type transistor is controlled by an output of the second voltage follower.

15 Claims, 11 Drawing Sheets

LINEAR RESISTOR WITH HIGH RESOLUTION AND BANDWIDTH

BACKGROUND

Figure 1:
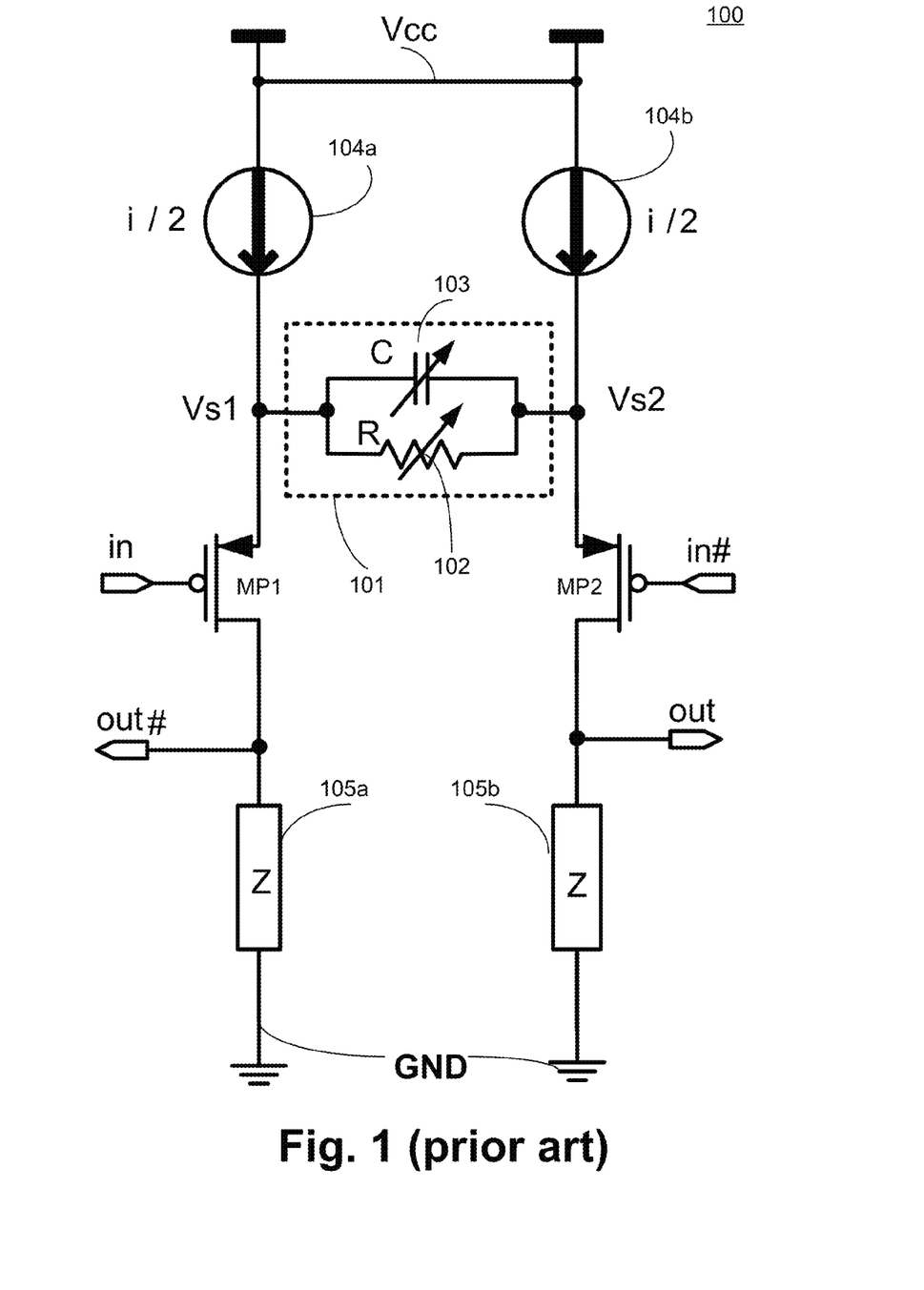
FIG. 1 is a Continuous-Time Linear Equalizer (CTLE) with programmable resistor.

FIG. 1 is a p-type input differential Continuous-Time Linear Equalizer (CTLE) 100 which comprises of input p-type transistors MP1 and MP2 with respective source terminals Vs1 and Vs2, a variable RC (resistor-capacitor) network 101 coupled between Vs1 and Vs2, and current sources 104a and 104b, where the input p-type transistors MP1 and MP2 are coupled to termination resistors 105a and 105b respectively. Current sources 104a and 104b are coupled to power supply node Vcc. Each current sources 104a and 104b may each provide current i/2. Termination resistors 105a and 105b are also coupled to ground (GND). Input p-type transistors MP1 and MP2 receive input signals "in" and "in#" at their respective gate terminals, where "in#" is inverse of "in." Output signals "out#" and "out" of CTLE 100 are coupled to source/drain terminals of MP1 and MP2 respectively, where "out#" is inverse of "out."

To adjust pole and zero locations of the CTLE, RC network 101 comprises variable resistor 102 and variable capacitor 103. As bandwidth requirements for the CTLE increase, having a linear resistor 102 (same as variable resistor 102) becomes a challenge. For example, a resistor bank having switchable resistances coupled together in parallel may be linear, but suffer from bandwidth degradation because of large parasitic capacitances on terminals Vs1 and Vs2 caused by the bank of parallel switchable resistances. High sheet resistance also results in lower bandwidth in such a configuration of resistors.

A simple Metal-Oxide Semiconductor (MOS) transistor based programmable resistor, for linear resistor 102, may provide high bandwidth, but it is a voltage dependent resistance suffers from common-mode variation. One configuration of a MOS transistor based programmable resistor is a PMOS with its source and drain terminals coupled to Vs1 and Vs2 and its gate terminal driven by a digital to analog (DAC) converter. However, changing voltages on terminals Vs1 and Vs2 causes the PMOS (or any MOS) device to have changing impedance. Additionally, body effect may make a MOS transistor (and hence MOS resistor) operate in out of linear operation region.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

The embodiments describe a programmable linear resistor having a higher bandwidth and linearity across common-mode voltages Vs1 and Vs2 than conventional transistor based resistors. In one embodiment, when the programmable linear resistor 102 is used with the degenerated-type CTLE (as described with reference to FIG. 1), the CTLE 100 exhibits very high bandwidth. For example, the bandwidth and linearity across common-mode voltages Vs1 and Vs2 is about 20% to 40% higher with the embodiments than with conventional designs.

In one embodiment, the programmable linear resistor uses a pair of voltage followers to track input common-mode voltage of a MOS transistor in negative feedback loop. In such an embodiment, the pair of voltage followers adjusts gate voltage of the MOS transistor to maintain the MOS resistance substantially constant. The embodiments stabilize the Vgs (gate to source voltage) of the MOS transistor across changing common-mode voltages (Vs1+Vs2)/2. The programmable linear resistor can be used in a number of circuits. For example, the programmable linear resistor may be used in a source degenerated CTLE, an Infinite Response Decision Feedback Equalizer (IIR-DFE), in termination impedances, and other circuits using linear resistances.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct electrical connection between the things that are connected, without any intermediary devices. The term "coupled" means either a direct electrical connection between the things that are connected, or an indirect connection through one or more passive or active intermediary devices. The term "circuit" means one or more passive and/or active components that are arranged to cooperate with one another to provide a desired function. The term "signal" means at least one current signal, voltage signal or data/clock signal. The meaning of "a", "an", and "the" include plural references. The meaning of "in" includes "in" and "on."

The term "scaling" refers to converting a design (schematic and layout) from one process technology to another process technology. The term "scaling" generally also refers to downsizing layout and devices within the same technology node. The terms "substantially," "close," "approximately," "near," "about," refers to being within +/−20% of a target value.

Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For purposes of the embodiments, the transistors are metal oxide semiconductor (MOS) transistors, which include drain, source, gate, and bulk terminals. Transistors can also be Tri-gate transistors or FinFETs. Source and drain terminals may be identical terminals and are interchangeably used herein. Those skilled in the art will appreciate that other transistors, for example, Bi-polar junction transistors—BJT PNP/NPN, BiCMOS, CMOS, eFET, etc., may be used without departing from the scope of the disclosure. The term "MN" indicates a n-type transistor (e.g., NMOS, NPN BJT, etc.) and the term "MP" indicates a p-type transistor (e.g., PMOS, PNP BJT, etc.).

Figure 2:
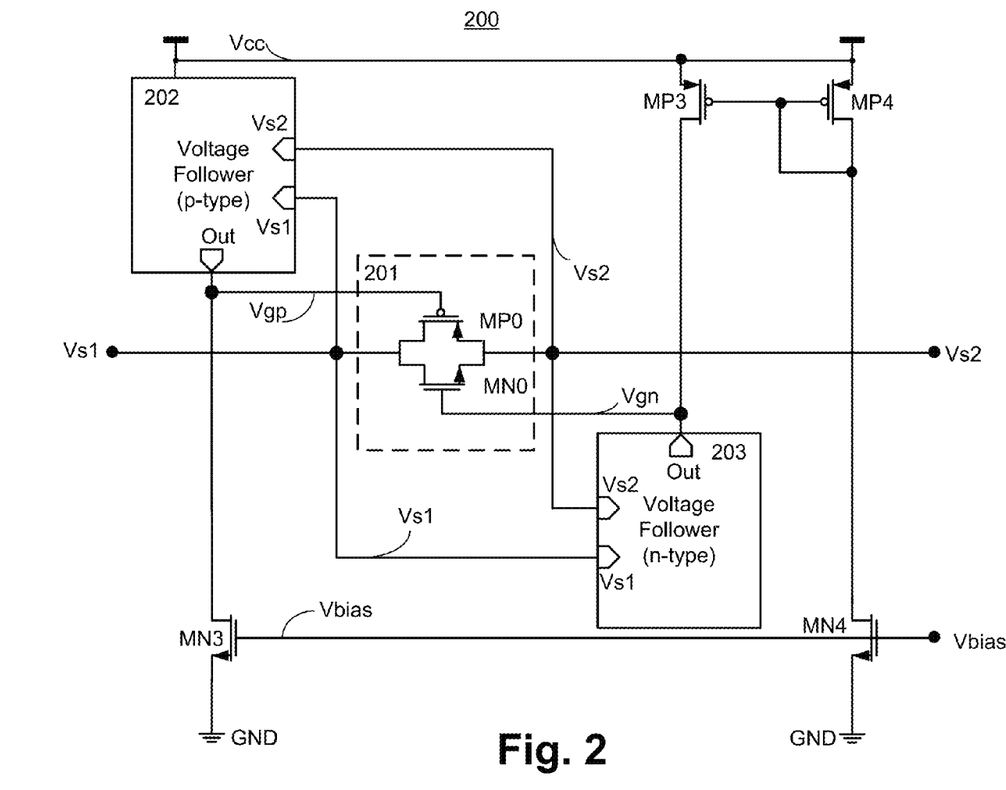
FIG. 2 is a high level voltage follower based linear resistor, according to one embodiment of the disclosure.

FIG. 2 is a high level voltage follower based linear resistor 200, according to one embodiment of the disclosure. It is pointed out that those elements of FIG. 2 having the same reference numbers (or names) as the elements of any other figure can operate or function in any manner similar to that described, but are not limited to such. In the following embodiments, the terms "nodes" and "voltages" or "signals" on those nodes are used interchangeably to refer to physical node or signal (voltage or current) on the node. For example, depending on the context, terms "node Vs1," "Vs1," "voltage Vs1," and the like, are used interchangeably.

In one embodiment, voltage follower based linear resistor 200 comprises pass-gate based resistor 201, a first voltage follower 202, a second voltage follower 203, and a bias network (including transistors MP3, MP4, MN3, and MN4), and bias reference (Vbias).

In one embodiment, the two terminals of the linear resistor 200 are Vs1 and Vs2. In one embodiment, the bias network includes a minor network of MP4 and MP3, where MP4 is biased via Vbias signal provided to the gate terminals of MN3 and MN4. In one embodiment, drain terminal of MN3 is coupled to first voltage follower 202. In one embodiment, drain terminal of MN4 is indirectly coupled to second voltage follower 203 via the minor network including MP4 and MP3. In one embodiment, transistors MN3 and MN4 are substantially the same size (W/L). In one embodiment, transistors MP4 and MP3 are substantially the same size. In other embodiments, transistors MP4 and MP3 may have different sizes to provide a multiplying current minor effect.

In one embodiment, variable resistor 201 (which is pass-gate) comprises one or more p-type devices MP0 coupled in parallel to one or more n-type devices MN0. In one embodiment, source/drain terminals of MP0 and MN0 are coupled to Vs1 and Vs2, as shown. In one embodiment, gate terminal of MP0 is controlled by output Vgp of first voltage follower 202. In one embodiment, gate terminal of MN0 is controlled by output Vgn of second voltage follower 203.

In one embodiment, first voltage follower 202 is a p-type voltage follower that follows voltages on nodes Vs1 and Vs2 and generates a corresponding voltage Out (same as Vgp) which tracks the voltages on nodes Vs1 and Vs2. In one embodiment, second voltage follower 203 is an n-type voltage follower that follows voltages on nodes Vs1 and Vs2 and generates a corresponding voltage Out (same as Vgn) which tracks the voltages on nodes Vs1 and Vs2. In one embodiment, first and second voltage followers 202 and 203 generate Vgp and Vgn respectively by tracking voltages on nodes Vs1 and Vs2 such that the Vgs of MP0 and MN0 is substantially constant. In such an embodiment, resistance of 201 is substantially linear across a wide range of Vs1 and Vs2. In one embodiment, resistance of 201 is varied by adjusting Vbias.

Figure 3A:
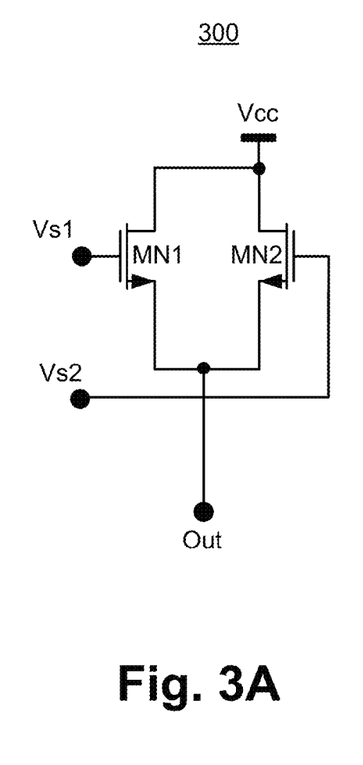
FIG. 3A is a voltage follower for the voltage follower based linear resistor, according to one embodiment of the disclosure.

FIG. 3A is a voltage follower 300 for the p-type voltage follower based linear resistor (e.g., 202), according to one embodiment of the disclosure. It is pointed out that those elements of FIG. 3A having the same reference numbers (or names) as the elements of any other figure can operate or function in any manner similar to that described, but are not limited to such. In the following embodiments, the terms nodes and voltages or signals on those nodes are used interchangeably.

In one embodiment, voltage follower 300 comprises a pair of n-type devices MN1 and MN2 coupled together in parallel. In one embodiment, Vs1 is coupled to the gate of MN1 and Vs2 is coupled to the gate of MN2. In one embodiment, source terminals of MN1 and MN2 are coupled to the output node Out (which is coupled to Vgn of FIG. 2). In one embodiment, drain terminals of MN1 and MN2 are coupled to the power supply Vcc.

Figure 3B:
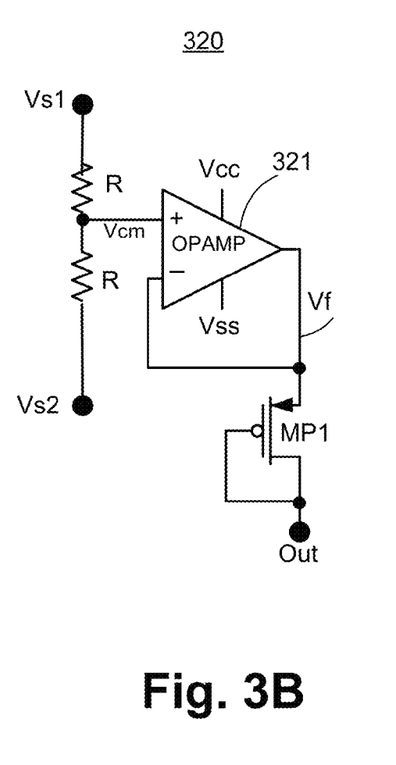
FIG. 3B is a voltage follower for the voltage follower based linear resistor, according to another embodiment of the disclosure.
Figure 3C:
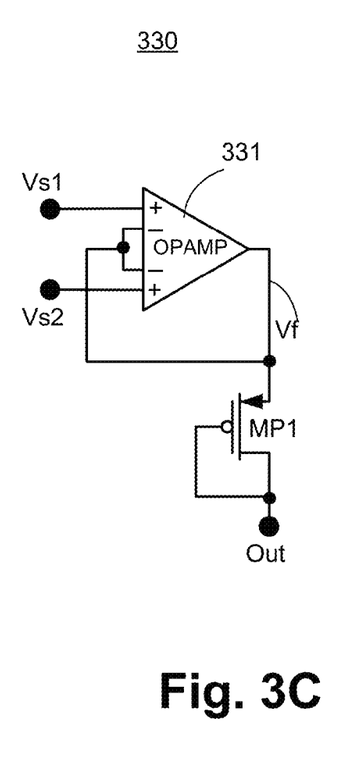
FIG. 3C is a voltage follower for the voltage follower based linear resistor, according to another embodiment of the disclosure.

In one embodiment, the feedback loop equations for voltage follower 300 driving the pass-gate resistor 201, are expressed as:

$$Vg-Vgsp-Vgsn=Vg \text{ for } MP0$$

$$Vg-Vgsn-Vgsp=Vg \text{ for } MN0$$

where Vg is the gate voltage, Vgsp=Vgs for PMOS MP0, and Vgsn=Vgs for NMOS MN0. Vgs or Vt of PMOS MP0 and NMOS MN0 are opposite in sign, so they cancel each other. The embodiment of FIG. 3A may provide higher bandwidth and lower power dissipation compared to the embodiments of FIG. 3B and FIG. 3C.

Referring back to FIG. 3A, in one embodiment a corresponding n-type voltage follower (not shown) based on the design of voltage follower 300 comprises a design which is complementary to the design of voltage follower 300. For example, MN1 and MN2 are replaced with p-type MP1 and MP2 transistors, Vcc is replaced with Vss (ground node), and the Out terminal is coupled to Vgn.

FIG. 3B is a voltage follower 320 for the p-type voltage follower based linear resistor (e.g., 202), according to another embodiment of the disclosure. It is pointed out that those elements of FIG. 3B having the same reference numbers (or names) as the elements of any other figure can operate or function in any manner similar to that described, but are not limited to such. In the embodiments, the terms nodes and voltages or signals on those nodes are used interchangeably.

In one embodiment, voltage follower 320 comprises an amplifier 321 (e.g., operational amplifier (OPAMP)), resistors R, and p-type device MP1. In one embodiment, negative terminal of the amplifier 321 is coupled to output Vf of the OPAMP. In one embodiment, positive terminal of amplifier 321 is coupled to some average of voltages Vs1 and Vs2. In one embodiment, amplifier 321 is a single stage OPAMP. In other embodiments, amplifier 321 is a multistage OPAMP e.g., with a first amplifying stage, a second amplifying stage, and a driver stage. In one embodiment, nodes Vs1 and Vs2 are coupled together via a pair of resistors, where the node between the resistors is coupled to the positive terminal of the amplifier 321. In such an embodiment, resistors R form a resistor divider to derive Vcm (common-mode voltage), which is input to the positive terminal of amplifier 321.

In one embodiment, MP1 is diode connected i.e., gate terminal of MP1 is coupled to the node Out. In such an embodiment, MP1 exhibits less body effect than it would otherwise. In one embodiment, node Out is coupled to node Vgp. In one embodiment, source terminal of MP1 is coupled to the output Vf of amplifier 321.

In one embodiment, the feedback loop equations for voltage follower 320 driving the pass-gate resistor 201 are expressed as:

$$Vg - Vgsp1 + Vgsp2 = Vg \text{ for } MP0$$

$$Vg - Vgsn1 + Vgsn2 = Vg \text{ for } MN0$$

where Vg is the gate voltage, Vgsp=Vgs for PMOS MP0, Vgsn=Vgs for NMOS MN0.

In one embodiment, a corresponding n-type voltage follower (not shown) based on the design of voltage follower 320 comprises a design which is complementary to the design of voltage follower 320. For example, p-type MP1 of FIG. 3B is replaced with an n-type transistor MN1 which is also diode connected with its gate coupled to its drain terminal which in turn is coupled to Vgn, and amplifier 321 output Vf is coupled to the source terminal of MN1.

FIG. 3C is a voltage follower 330 for the voltage follower based linear resistor, according to another embodiment of the disclosure. It is pointed out that those elements of FIG. 3C having the same reference numbers (or names) as the elements of any other figure can operate or function in any manner similar to that described, but are not limited to such. The embodiment of FIG. 3C is similar to the embodiment of FIG. 3B.

In one embodiment, voltage follower 330 comprises an amplifier 331 (e.g., operational amplifier (OPAMP)) and p-type device MP1. In this embodiment, amplifier 331 is at least a four input amplifier with two negative terminals and two positive terminals. In one embodiment, negative terminals of amplifier 331 are coupled to output Vf of amplifier 331. In one embodiment, first positive terminal of amplifier 331 is coupled to node Vs1 and second positive terminal of amplifier 331 is coupled to node Vs2. In one embodiment, amplifier 331 is a single stage OPAMP. In other embodiments, amplifier 331 is a multistage OPAMP e.g., with a first amplifying stage, a second amplifying stage, and a driver stage.

In one embodiment, MP1 is diode connected i.e., gate terminal of MP1 of FIG. 3C is coupled to the node Out. In such an embodiment, MP1 exhibits less body effect than it would otherwise. In one embodiment, node Out is coupled to node Vgp. In one embodiment, source terminal of MP1 is coupled to the output Vf of amplifier 331.

In one embodiment, the feedback loop equations for voltage follower 330 driving the pass-gate resistor 201 are expressed as:

$$Vg - Vgsp1 + Vgsp2 = Vg \text{ for } MP0$$

$$Vg - Vgsn1 + Vgsn2 = Vg \text{ for } MN0$$

where Vg is the gate voltage, Vgsp=Vgs for PMOS MP0, Vgsn=Vgs for NMOS MN0.

In one embodiment, a corresponding n-type voltage follower (not shown) based on the design of voltage follower 330 comprises a design which is complementary to the design of voltage follower 330. For example, p-type MP1 is replaced with an n-type transistor MN1 which is also diode connected with its gate coupled to its drain terminal which in turn is coupled to Vgn, and amplifier 331 output Vf is coupled to the source terminal of MN1.

Figure 4:
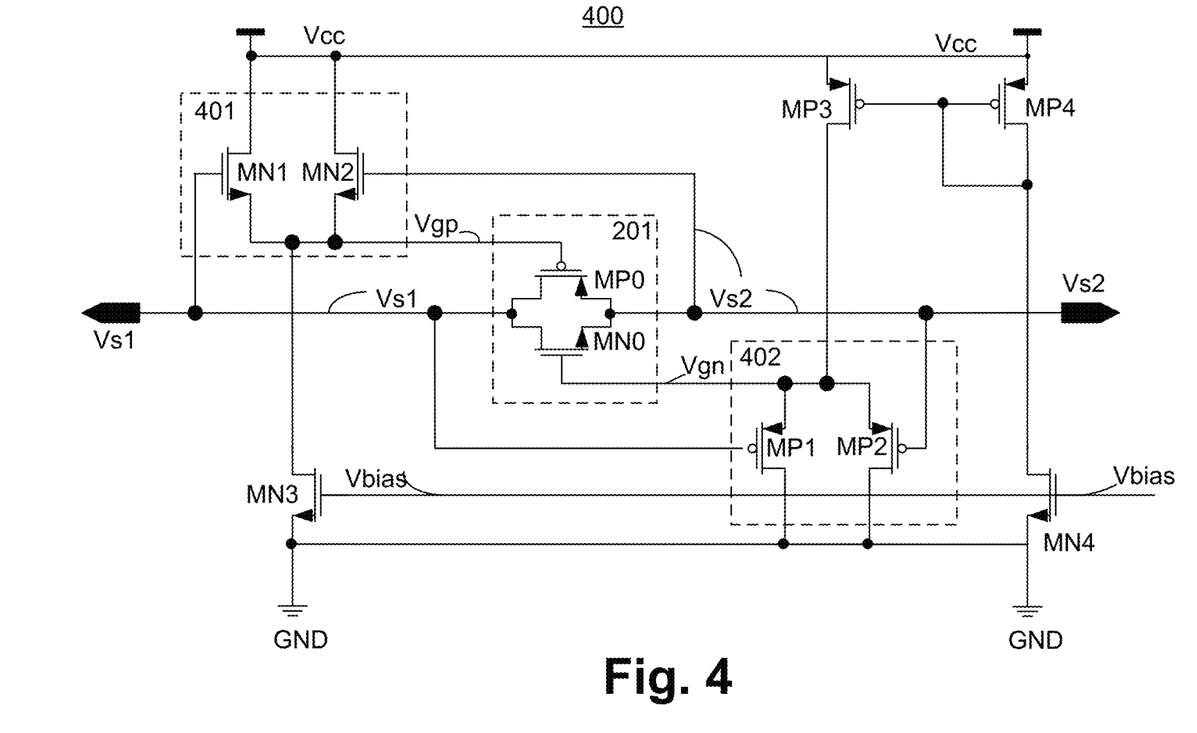
FIG. 4 is a circuit level voltage follower based linear resistor, according to one embodiment of the disclosure.

FIG. 4 circuit level voltage follower based linear resistor 400, according to one embodiment of the disclosure. It is pointed out that those elements of FIG. 4 having the same reference numbers (or names) as the elements of any other figure can operate or function in any manner similar to that described, but are not limited to such. The embodiment of FIG. 4 is similar to the embodiment of FIG. 2, except that it uses the voltage follower of FIG. 3A. So as not to obscure the embodiments, FIG. 4 is not described again because it is similar to FIG. 2.

In one embodiment, first voltage follower 401 of the voltage follower based linear resistor 400 comprises one or more n-type transistors MN1 and MN2 coupled together in parallel. In one embodiment, gate terminal of MN2 is coupled to node Vs2 while the gate terminal of MN1 is coupled to Vs1. In one embodiment, drain terminals of MN1 and MN2 are coupled to Vcc, and source terminals of MN1 and MN2 form the output node Out (same as node Vgp) which is coupled to the gate terminal of MP0 of resistor 201.

In one embodiment, second voltage follower 402 of voltage follower based linear resistor 400 comprises one or more p-type transistors MP1 and MP2 coupled together in parallel. In one embodiment, gate terminal of MP2 is coupled to node Vs2 while the gate terminal of MP1 is coupled to node Vs1. In one embodiment, drain terminals of MP1 and MP2 are coupled to Vss (Ground), and source terminals of MP1 and MP2 form the output node Out (of 203 in FIG. 2, same as node Vgn) which is coupled to the gate terminal of MN0 of resistor 201.

Figure 5:
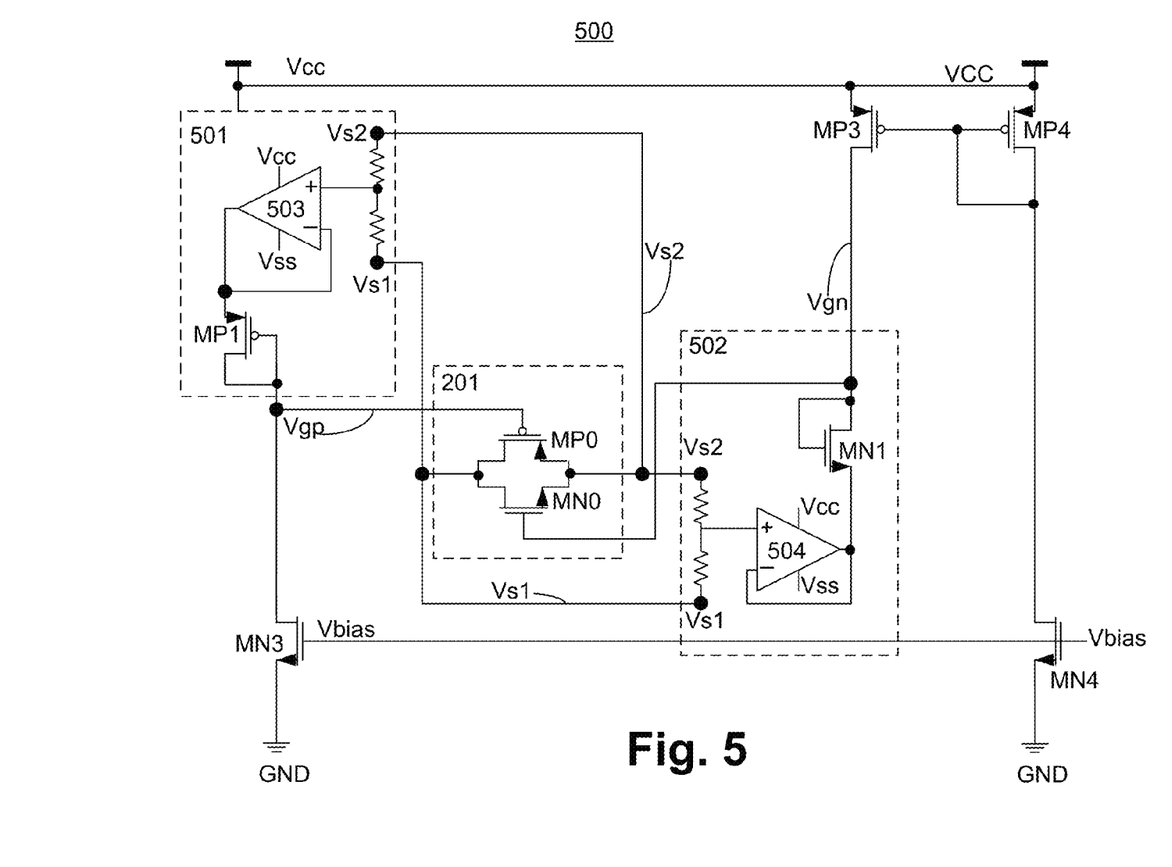
FIG. 5 is a circuit level voltage follower based linear resistor, according to another embodiment of the disclosure.

FIG. 5 circuit level voltage follower based linear resistor 500, according to another embodiment of the disclosure. It is pointed out that those elements of FIG. 5 having the same reference numbers (or names) as the elements of any other figure can operate or function in any manner similar to that described, but are not limited to such. The embodiment of FIG. 5 is similar to the embodiment of FIG. 2, except that it uses the voltage follower of FIG. 3B. So as not to obscure the embodiments, FIG. 5 is not described again because it is similar to FIG. 2.

In one embodiment, first voltage follower 501 comprises an amplifier 503 (same as amplifier 321) coupled to resistors and diode connected p-type MP1 as discussed with reference to FIG. 3B. In one embodiment, nodes Vs2 and Vs1 are coupled to the resistors of first voltage follower 501, where the resistors are used to generate common-mode voltage Vcm which is input to the positive terminal of the amplifier 503. In one embodiment, the output node of first voltage follower 501 (i.e., node Vgp) is coupled to the diode connected MP1 which controls the gate of MP0 of resistor 201.

In one embodiment, second voltage follower 502 comprises an amplifier 504 (same as amplifier 321) coupled to resistors and diode connected n-type MN1 as discussed with reference to FIG. 3B. In one embodiment, nodes Vs2 and Vs1 are coupled to the resistors of second voltage follower 502, where the resistors are used to generate common-mode voltage Vcm which is input to the positive terminal of amplifier 504. In one embodiment, output node of second voltage follower 502 (i.e., node Vgn) is coupled to diode connected MN1 which controls the gate of MN0 of resistor 201.

Figure 6:
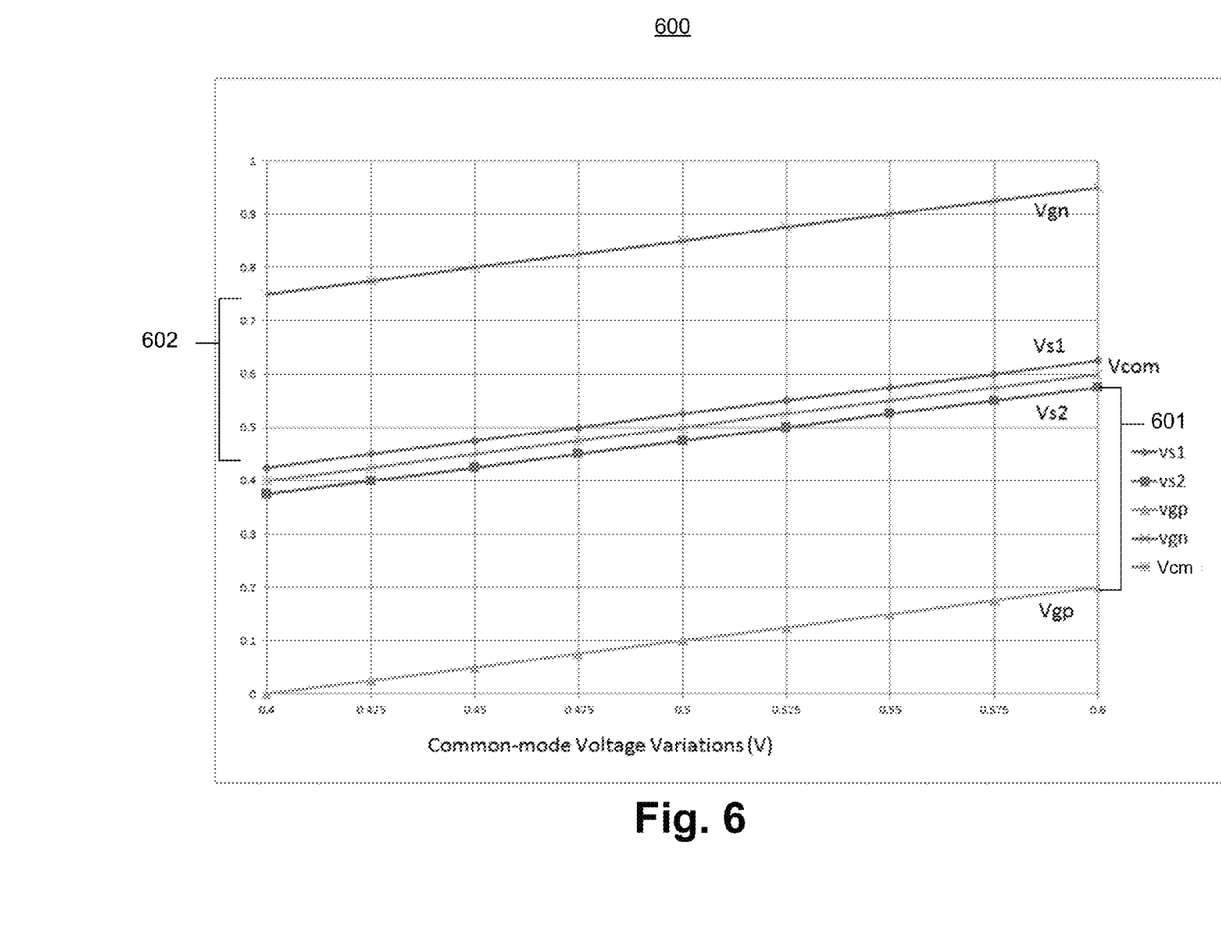
FIG. 6 is a plot illustrating tracking of bias voltages with common-mode voltage variation for the voltage follower based linear resistor, according to another embodiment of the disclosure.

FIG. 6 is a plot 600 illustrating tracking of bias voltages Vgn and Vgp with common-mode voltage Vcm variation for the voltage follower based linear resistor (e.g., 200, 400, 500), according to another embodiment of the disclosure. It is pointed out that those elements of FIG. 6 having the same reference numbers (or names) as the elements of any other figure can operate or function in any manner similar to that described, but are not limited to such.

The x-axis and the y-axis are voltages. The y-axis represents common-mode (Vcm) voltage variation. The plot shows bias voltages Vgn, Vgp, resistor node voltages Vs1 and Vs2, and their common-mode voltage Vcm, where Vcm=(Vs1+Vs2)/2. The plot illustrates that the voltage difference 601 between voltages Vgn and Vs1 and voltages Vgp and Vs2 is substantially maintained (i.e., substantially remains constant) over a wide range Vcm variations. In one embodiment, first and second voltage followers 202 and 203 generate Vgp and Vgn respectively and cause them to track with common-mode voltage Vcm variation which results in a substantially linear resistor.

Figure 7:
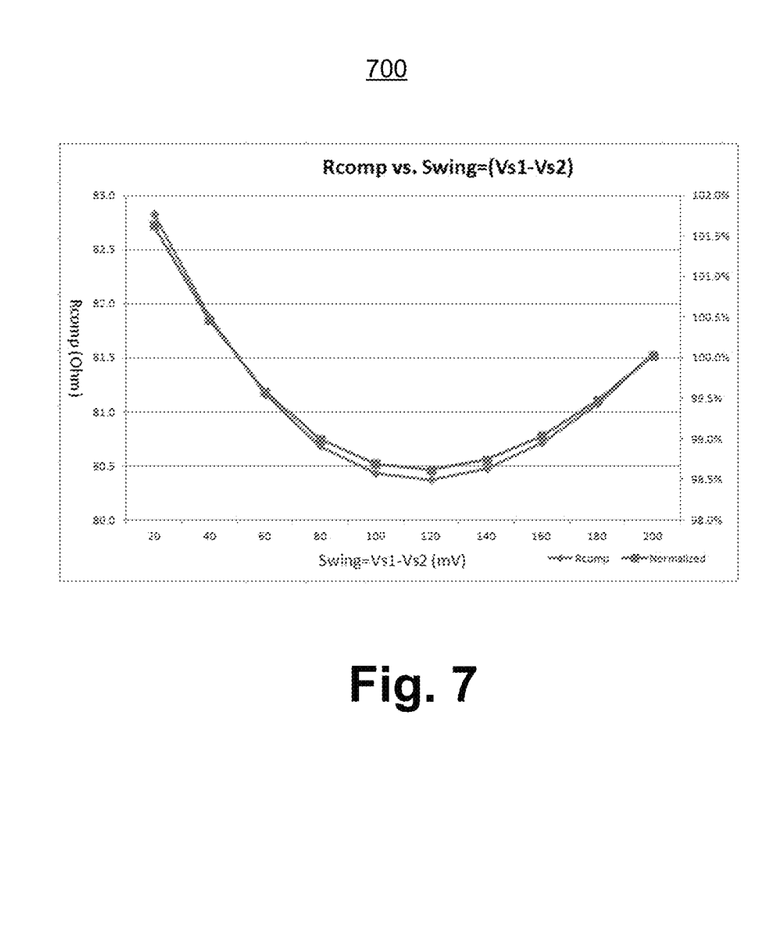
FIG. 7 is a plot illustrating a substantially linear voltage follower based resistor across input signal swing, according to one embodiment of the disclosure.

FIG. 7 is a plot 700 illustrating a substantially linear voltage follower based resistor across input signal swing, according to one embodiment of the disclosure. It is pointed out that those elements of FIG. 7 having the same reference numbers (or names) as the elements of any other figure can operate or function in any manner similar to that described, but are not limited to such.

The x-axis is voltage swing or amplitude (defined as voltages Vs1-Vs2) in mV, and the y-axis is resistance of resistor 201. The right hand y-axis illustrates the resistance difference in percentage. The plot illustrates that as voltages on nodes Vs1 and Vs2 vary in voltage swing from 20 mV to 200 mV (for example), the resistance of resistor 201 (coupled to nodes Vs1 and Vs2) remains substantially constant. In this example, the resistance remains within 2% of its ideal (target) value.

Figure 8A:
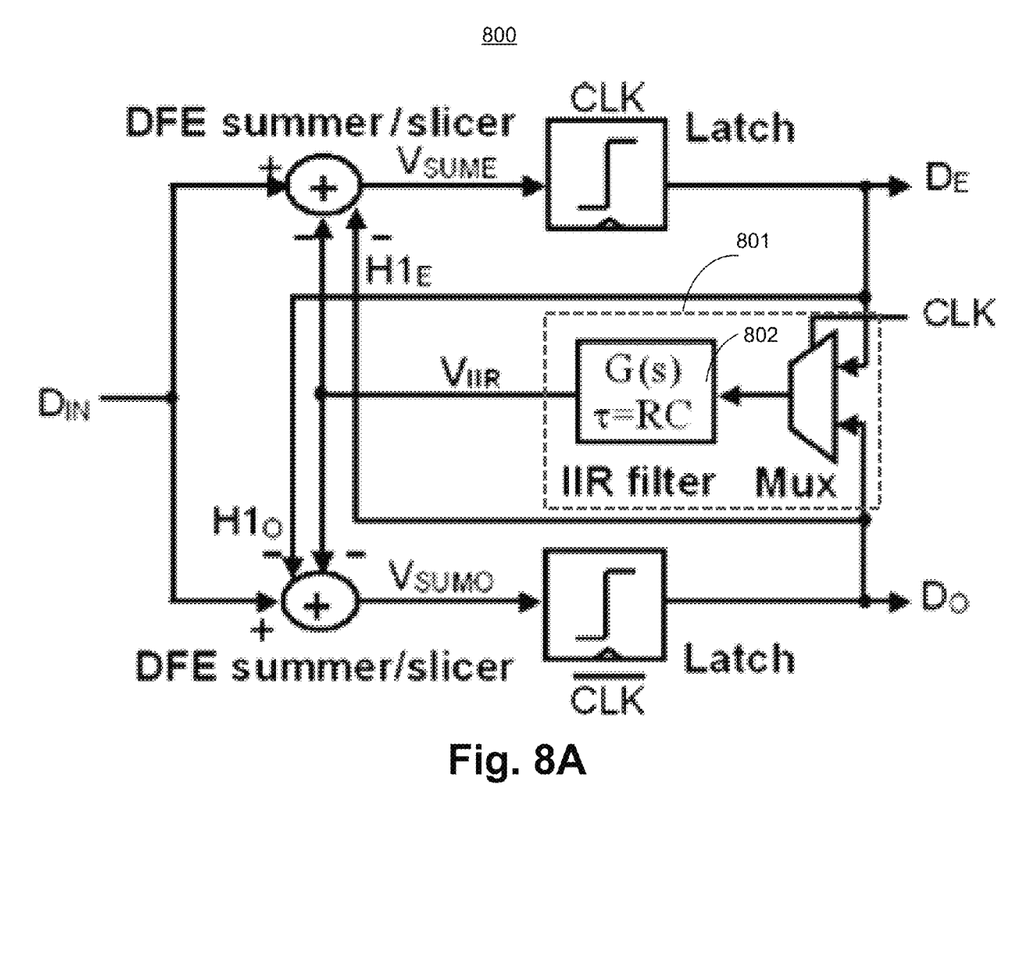
FIG. 8A is an Infinite Impulse Response Decision Feedback Equalizer (IIR-DFE) with voltage follower based linear resistor, according to one embodiment of the disclosure.

FIG. 8A is an Infinite Impulse Response Decision Feedback Equalizer (IIR-DFE) 800 with voltage follower based linear resistor, according to one embodiment of the disclosure. In one embodiment, IIR-DFE 800 includes a unit 801 multiplexer and IIR-filter, where the IIR-filter includes the voltage follower based linear resistor. Since, the high level architecture of IIR-DFE 800 (without the voltage follower based linear resistor) is well known, it is not described. In one embodiment, unit 801 includes an RC filter 802, where the resistance of the RC filter 802 is implemented with the voltage follower based linear resistor according to any of the embodiments discussed in the disclosure.

Figure 8B:
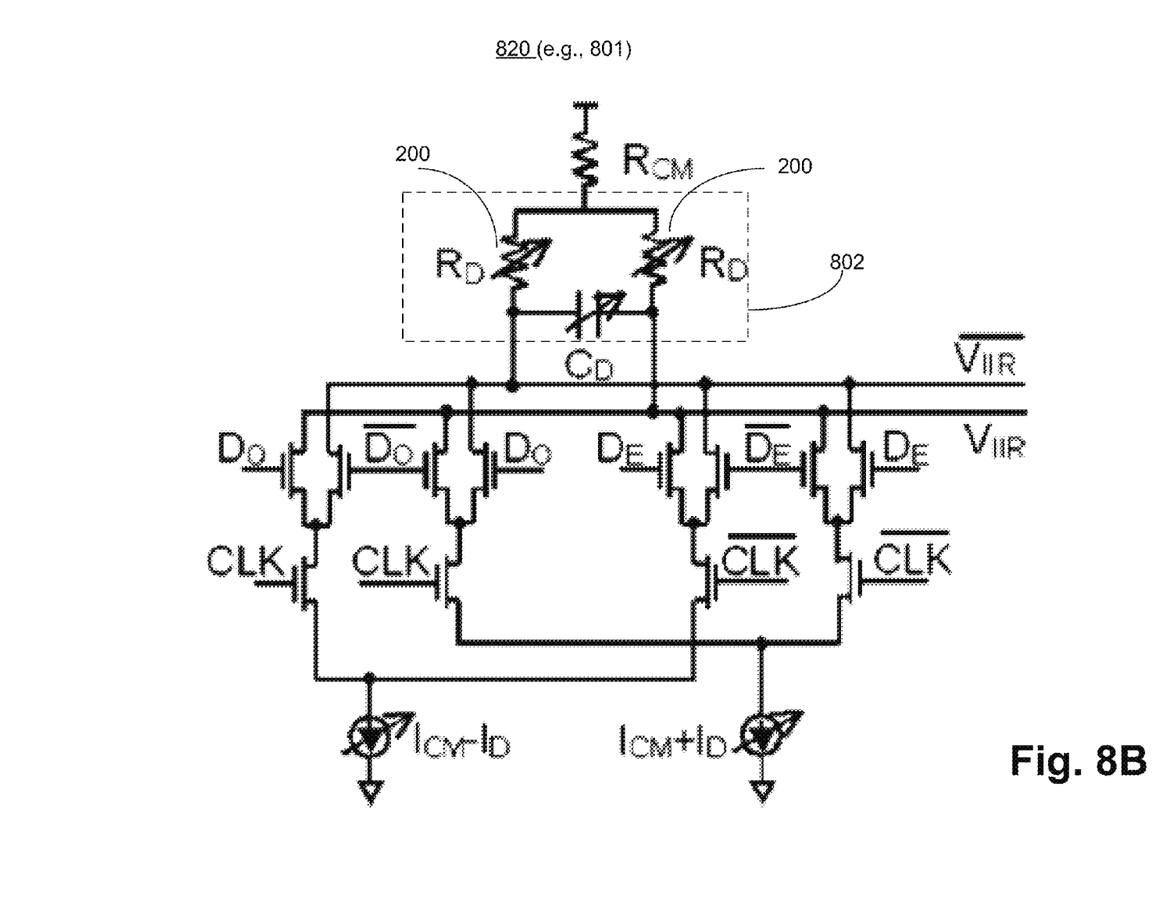
FIG. 8B is a circuit implementation of the IIR-filter and Multiplexer of the IIR-DFE, according to one embodiment of the disclosure.

FIG. 8B is a circuit implementation 820 of the unit 801 having the IIR-filter and Multiplexer of the IIR-DFE, according to one embodiment of the disclosure. It is pointed out that those elements of FIG. 8B having the same reference numbers (or names) as the elements of any other figure can operate or function in any manner similar to that described, but are not limited to such.

In one embodiment, circuit implementation 800 comprises resistors Rd and capacitor Cd forming the RC filter 802. In one embodiment, resistors Rd are implemented as voltage follower based linear resistor according to any of the embodiments discussed in the disclosure. However, it is pointed out that any circuit requiring or desiring a linear resistance across two terminals may use the embodiments of the voltage follower based linear resistor.

Figure 9:
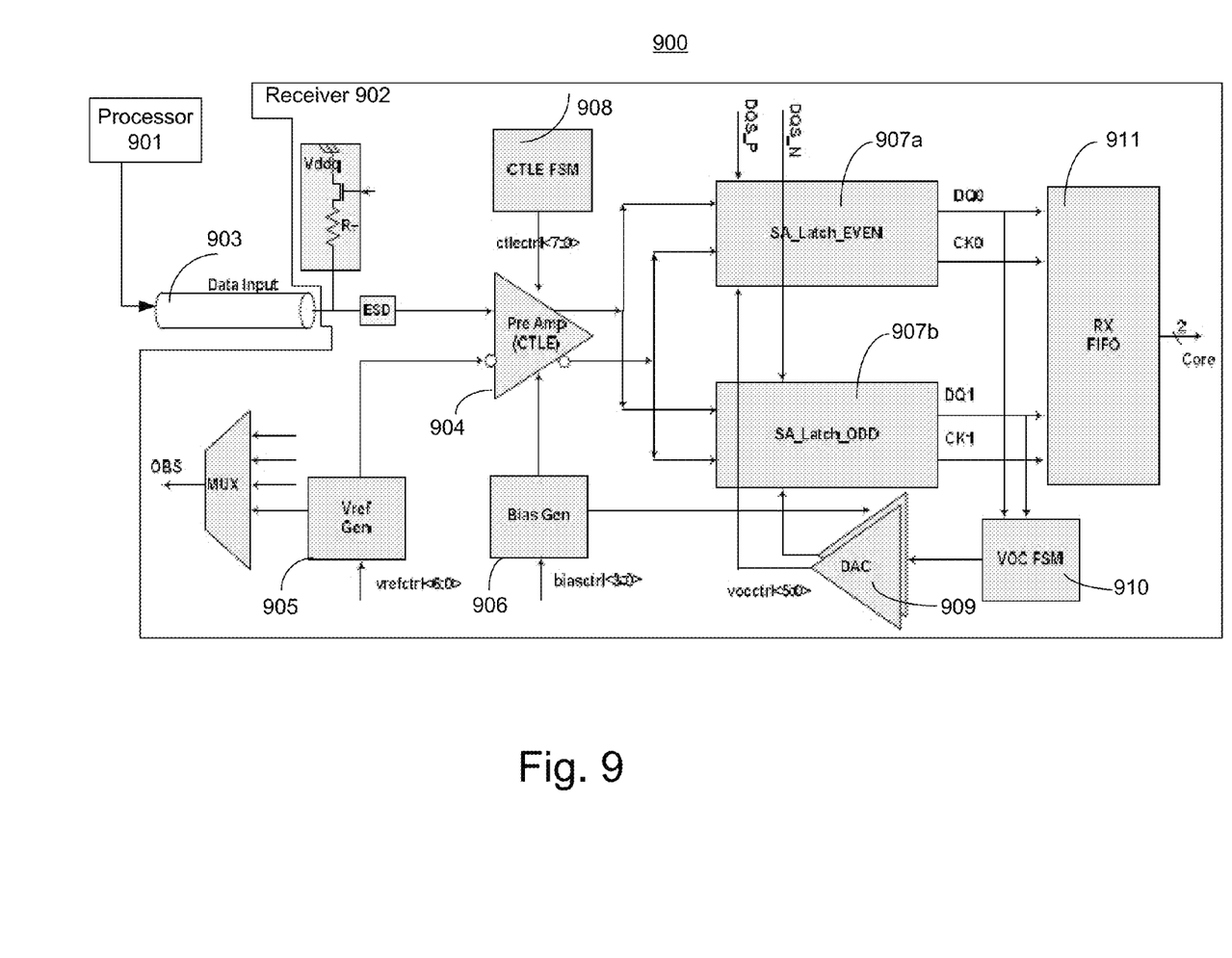
FIG. 9 is a computer system with a bi-directional single-ended input-output (I/O) having a CTLE with the voltage follower based linear resistor, according to one embodiment of the disclosure.

FIG. 9 is a computer system 900 with a bi-directional single-ended input-output (I/O) having a CTLE with the voltage follower based linear resistor, according to one embodiment of the disclosure. It is pointed out that those elements of FIG. 9 having the same reference numbers (or names) as the elements of any other figure can operate or function in any manner similar to that described, but are not limited to such.

In one embodiment, computer system 900 comprises a first processor 901 coupled to a bi-directional single-ended input-output (I/O) receiver 902 of a second processor via a transmission media 903. In one embodiment, receiver 902 is a serial I/O receiver. In one embodiment, receiver 902 includes Pre-Amplifier (Pre Amp (CTLE)) 904, reference generator 905 (Vref Gen 905), bias generator 906 (Bias Gen 906), Sense-Amplifier Latches 907a (SA_Latch_EVEN) and 907b (SA_Latch_ODD), CTLE finite state machine (FSM) 908 (CTLE FSM 908), digital to analog converter (DAC) 909, voltage offset control (VOC) FSM 910, receiver (RX) FIFO (First-in First-out) 911, and many peripheral circuits.

In one embodiment, Pre-Amplifier 904 is used for Electrical-Over-Stress (EOS) protection from a supply Vcc (e.g., 1.35V supply). In one embodiment, Pre-Amplifier 904 is a linear amplifier to act as Continuous-Time Linear Equalizer (CTLE). In one embodiment, Sense-Amplifier (SA) 907a and 907b include differential comparators as decision slicers to determine logic "1" or "0" in even and odd path. In one embodiment, each Sense-Amplifier 907a and 907b have offset cancellation DAC 909. In one embodiment, the offset cancellation DAC 909 is a 6-bit offset cancellation DAC. In other embodiments, other number of bits may be used for the offset cancellation DAC 909.

In one embodiment, bias generator 906 has 4-bits of bias control to program gain Pre-Amplifier 904, 8-bit CTLE control to program equalization setting, and 7-bits of Vref control. In other embodiments, other number of bits may be used for the bias control signals. In one embodiment, Pre-Amplifier 904 has input-referred offset. In one embodiment, in order to adjust pole and zero of the Pre-Amplifier 904, the Pre-Amplifier 904 has banks of capacitors and resistors as degeneration components to provide programmability. In one embodiment, the Pre-Amplifier 904 is similar to the CTLE 100 of FIG. 1, but the voltage follower based linear resistor 200 is used as resistor 102.

Figure 10:
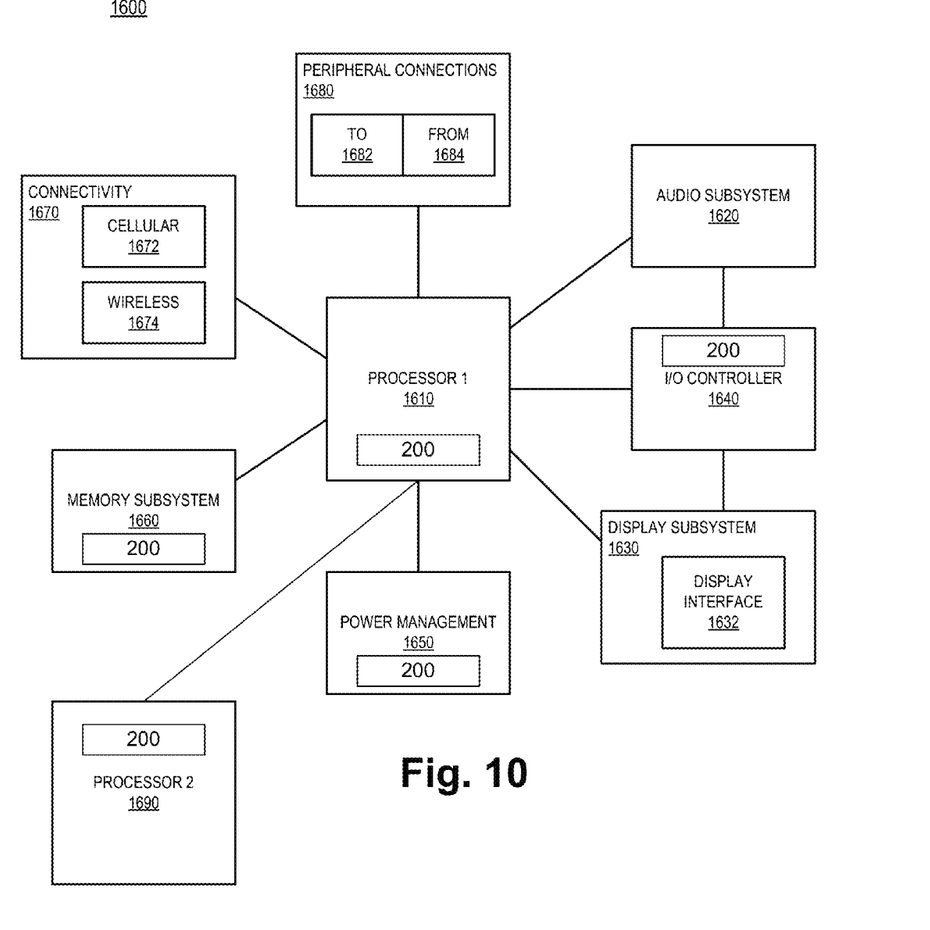
FIG. 10 is a smart device or a computer system with the voltage follower based linear resistor, according to one embodiment of the disclosure.

FIG. 10 is a smart computing device 1600 or a computer system or SOC (System-on-Chip) with the voltage follower based linear resistor, according to one embodiment of the disclosure. It is pointed out that those elements of FIG. 10 having the same reference numbers (or names) as the elements of any other figure can operate or function in any manner similar to that described, but are not limited to such. FIG. 10 also illustrates a block diagram of an embodiment of a mobile device in which flat surface interface connectors could be used. In one embodiment, computing device 1600 represents a mobile computing device, such as a computing tablet, a mobile phone or smart-phone, a wireless-enabled e-reader, or other wireless mobile device. It will be understood that certain components are shown generally, and not all components of such a device are shown in computing device 1600.

In one embodiment, computing device 1600 includes a first processor 1610 with the voltage follower based linear resistor 200, and a second processor 1690 with the voltage follower based linear resistor 200, according to the embodiments discussed herein. Other blocks of the computing device with I/O drivers may also include the voltage follower based linear resistor 200. The various embodiments of the present disclosure may also comprise a network interface within 1670 such as a wireless interface so that a system embodiment may be incorporated into a wireless device, for example, cell phone or personal digital assistant.

In one embodiment, processor 1610 can include one or more physical devices, such as microprocessors, application processors, microcontrollers, programmable logic devices, or other processing means. The processing operations performed by processor 1610 include the execution of an operating platform or operating system on which applications and/or device functions are executed. The processing operations include operations related to I/O (input/output) with a human user or with other devices, operations related to power management, and/or operations related to connecting the computing device 1600 to another device. The processing operations may also include operations related to audio I/O and/or display I/O.

In one embodiment, computing device 1600 includes audio subsystem 1620, which represents hardware (e.g., audio hardware and audio circuits) and software (e.g., drivers, codecs) components associated with providing audio functions to the computing device 1600. Audio functions can include speaker and/or headphone output, as well as microphone input. Devices for such functions can be integrated into computing device 1600, or connected to the computing device 1600. In one embodiment, a user interacts with the computing device 1600 by providing audio commands that are received and processed by processor 1610.

Display subsystem 1630 represents hardware (e.g., display devices) and software (e.g., drivers) components that provide a visual and/or tactile display for a user to interact with the computing device. Display subsystem 1630 includes display interface 1632, which includes the particular screen or hardware device used to provide a display to a user. In one embodiment, display interface 1632 includes logic separate from processor 1610 to perform at least some processing related to the display. In one embodiment, display subsystem 1630 includes a touch screen (or touch pad) device that provides both output and input to a user.

I/O controller 1640 represents hardware devices and software components related to interaction with a user. I/O controller 1640 is operable to manage hardware that is part of audio subsystem 1620 and/or display subsystem 1630. Additionally, I/O controller 1640 illustrates a connection point for additional devices that connect to computing device 1600 through which a user might interact with the system. For example, devices that can be attached to the computing device 1600 might include microphone devices, speaker or stereo systems, video systems or other display device, keyboard or keypad devices, or other I/O devices for use with specific applications such as card readers or other devices.

As mentioned above, I/O controller 1640 can interact with audio subsystem 1620 and/or display subsystem 1630. For example, input through a microphone or other audio device can provide input or commands for one or more applications or functions of the computing device 1600. Additionally, audio output can be provided instead of, or in addition to display output. In another example, if display subsystem 1630 includes a touch screen, the display device also acts as an input device, which can be at least partially managed by I/O controller 1640. There can also be additional buttons or switches on the computing device 1600 to provide I/O functions managed by I/O controller 1640.

In one embodiment, I/O controller 1640 manages devices such as accelerometers, cameras, light sensors or other environmental sensors, or other hardware that can be included in the computing device 1600. The input can be part of direct user interaction, as well as providing environmental input to the system to influence its operations (such as filtering for noise, adjusting displays for brightness detection, applying a flash for a camera, or other features).

In one embodiment, computing device 1600 includes power management 1650 that manages battery power usage, charging of the battery, and features related to power saving operation. Memory subsystem 1660 includes memory devices for storing information in computing device 1600. Memory can include nonvolatile (state does not change if power to the memory device is interrupted) and/or volatile (state is indeterminate if power to the memory device is interrupted) memory devices. Memory 1660 can store application data, user data, music, photos, documents, or other data, as well as system data (whether long-term or temporary) related to the execution of the applications and functions of the computing device 1600.

Elements of embodiments are also provided as a machine-readable medium (e.g., memory 1660) for storing the computer-executable instructions (e.g., instructions to implement any other processes discussed herein). The machine-readable medium (e.g., memory 1660) may include, but is not limited to, flash memory, optical disks, CD-ROMs, DVD ROMs, RAMs, EPROMs, EEPROMs, magnetic or optical cards, or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 1670 includes hardware devices (e.g., wireless and/or wired connectors and communication hardware) and software components (e.g., drivers, protocol stacks) to enable the computing device 1600 to communicate with external devices. The computing device 1600 could be separate devices, such as other computing devices, wireless access points or base stations, as well as peripherals such as headsets, printers, or other devices.

Connectivity 1670 can include multiple different types of connectivity. To generalize, the computing device 1600 is illustrated with cellular connectivity 1672 and wireless connectivity 1674. Cellular connectivity 1672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity 1674 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 1680 include hardware interfaces and connectors, as well as software components (e.g., drivers, protocol stacks) to make peripheral connections. It will be understood that the computing device 1600 could both be a peripheral device ("to" 1682) to other computing devices, as well as have peripheral devices ("from" 1684) connected to it. The computing device 1600 commonly has a "docking" connector to connect to other computing devices for purposes such as managing (e.g., downloading and/or uploading, changing, synchronizing) content on device 1600. Additionally, a docking connector can allow computing device 1600 to connect to certain peripherals that allow the computing device 1600 to control content output, for example, to audiovisual or other systems.

In addition to a proprietary docking connector or other proprietary connection hardware, the computing device 1600 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other type.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented i.e., such specifics should be well within purview of one skilled in the art. Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

For example, in one embodiment, an apparatus comprises: a first voltage follower; a second voltage follower; and a pass-gate including a p-type transistor in parallel to an n-type transistor, wherein gate terminal of the p-type transistor is controlled by an output of the first voltage follower, and wherein gate terminal of the n-type transistor is controlled by an output of the second voltage follower.

In one embodiment, the first and second voltage followers have corresponding first and second inputs coupled to either non-gate terminals of the pass-gate. In one embodiment, the first voltage follower comprises at least two n-type transistors coupled in parallel to one another. In one embodiment, gate terminals of the at least two n-type transistors are coupled to corresponding first and second inputs respectively, wherein source terminals of the at least two n-type transistors are coupled to the output of the first voltage follower, and wherein drain terminals of the at least two n-type transistors are coupled to a power supply node.

In one embodiment, apparatus further comprises a current mirror coupled to the outputs of the first and second voltage followers. In one embodiment, the first voltage follower is a p-type voltage follower, and wherein the second voltage follower is an n-type voltage follower. In one embodiment, the first voltage follower comprises an OPAMP with an output coupled to a p-type transistor. In one embodiment, the p-type transistor is diode connected. In one embodiment, the OPAMP includes a first input coupled to the first and second inputs of the first voltage follower via resistive elements, and wherein the OPAMP includes a second input coupled to the output of the OPAMP.

In one embodiment, the OPAMP includes four input terminals, wherein the first and second inputs are coupled to two positive terminals of the OPAMP, and wherein the output of the OPAMP is coupled to two negative terminals of the OPAMP. In one embodiment, the second voltage follower comprises at least two p-type transistors coupled in parallel to one another. In one embodiment, gate terminals of the at least two p-type transistors are coupled to corresponding first and second inputs respectively, wherein source terminals of the at least two n-type transistors are coupled to the output of the second voltage follower, and wherein drain terminals of the at least two p-type transistors are coupled to a ground node.

In another example, an apparatus comprises: a Continuous-Time Linear Equalizer (CTLE) with programmable linear resistor, the programmable linear resistor comprising: a first input; a second input; a first voltage follower; a second voltage follower; and a pass-gate including a p-type transistor in parallel to an n-type transistor, wherein gate terminal of the p-type transistor is controlled by an output of the first voltage follower, wherein gate terminal of the n-type transistor is controlled by an output of the second voltage follower, and wherein the first and second inputs are coupled to either non-gate terminals of the pass-gate.

In one embodiment, the first voltage follower is a p-type voltage follower, and wherein the second voltage follower is an n-type voltage follower. In one embodiment, the first and second voltage followers have corresponding first and second inputs coupled to the either non-gate terminals of the pass-gate. In one embodiment, the programmable linear resistor further comprises a current mirror coupled to the outputs of the first and second voltage followers.

In another example, a system comprises a memory unit; a processor, coupled to the memory unit, the processor including an receiver with a programmable resistor according to any of the embodiments discussed in the disclosure; and a wireless interface for allowing the processor to communicate with another device. In one embodiment, the system further comprises a display unit.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
   a first voltage follower coupled to sink current from a power supply node;
   a second voltage follower coupled to source current to a reference node; and
   a pass-gate including a p-type transistor in parallel with an n-type transistor, wherein a gate terminal of the p-type transistor is coupled to an output of the first voltage follower, and wherein a gate terminal of the n-type transistor is coupled to an output of the second voltage follower, wherein the first and second voltage followers each have corresponding first and second inputs respectively driven by the non-gate terminals of the pass-gate;
   a current mirror arrangement coupled to the outputs of the first and second voltage followers such that a first current sourced from an output of one of the voltage followers is in proportion to a second current sourced into an output of the other of the voltage followers.

2. The apparatus of claim 1, wherein the first voltage follower comprises at least two n-type transistors coupled in parallel to one another.

3. The apparatus of claim 2, wherein gate terminals of the at least two n-type transistors are coupled to the corresponding first and second inputs of the first voltage follower, wherein source terminals of the at least two n-type transistors are coupled to the output of the first voltage follower, and wherein drain terminals of the at least two n-type transistors are coupled to the power supply node.

4. The apparatus of claim 1, wherein the first voltage follower is a p-type voltage follower, and wherein the second voltage follower is an n-type voltage follower.

5. The apparatus of claim 1, wherein the first voltage follower comprises an OPAMP with an output coupled to a p-type transistor.

6. The apparatus of claim 5, wherein the p-type transistor is diode connected.

7. The apparatus of claim 5, wherein the OPAMP includes a first input coupled to the first and second inputs of the first voltage follower via resistive elements, and wherein the OPAMP includes a second input coupled to the output of the OPAMP.

8. The apparatus of claim 5, wherein the OPAMP includes four input terminals, wherein the first and second inputs are coupled to two positive terminals of the OPAMP, and wherein the output of the OPAMP is coupled to two negative terminals of the OPAMP.

9. The apparatus of claim 1, wherein the second voltage follower comprises at least two p-type transistors coupled in parallel to one another.

10. The apparatus of claim 9, wherein gate terminals of the at least two p-type transistors are coupled to corresponding first and second inputs of the second voltage follower, wherein source terminals of the at least two p-type transistors are coupled to the output of the second voltage follower, and wherein drain terminals of the at least two p-type transistors are coupled to the reference node.

11. An apparatus comprising:
    a Continuous-Time Linear Equalizer (CTLE) with programmable linear resistor, the programmable linear resistor comprising:
    a first input;
    a second input;
    a first voltage follower coupled to sink current from a power supply node;
    a second voltage follower coupled to source current to a reference node; and
    a pass-gate including a p-type transistor in parallel with an n-type transistor, wherein a gate terminal of the p-type transistor is coupled to an output of the first voltage follower, wherein a gate terminal of the n-type transistor is coupled to an output of the second voltage follower, wherein the first and second voltage followers each have first and second inputs that are driven by the non-gate terminals of the pass-gate; and,
    a current mirror arrangement coupled to the outputs of the first and second voltage followers such that a first current sourced from an output of one of the voltage followers is in proportion to a second current sourced into an output of the other of the voltage followers.

12. The apparatus of claim 11, wherein the first voltage follower is a p-type voltage follower, and wherein the second voltage follower is an n-type voltage follower.

13. A system comprising:
    i) memory unit;
    ii) a processor, coupled to the memory unit, the processor including a receiver with a programmable resistor comprising a), b), c) and d) below:
       a) a first voltage follower coupled to sink current from a power supply node;
       b) a second voltage follower coupled to source current to a reference node;
       c) a pass-gate including a p-type transistor in parallel with an n-type transistor, wherein a gate terminal of the p-type transistor is coupled to an output of the first voltage follower, and wherein a gate terminal of the n-type transistor is coupled to an output of the second voltage follower, wherein the first and second voltage followers each have corresponding first and second inputs respectively driven by the non-gate terminals of the pass-gate;
       d) current mirror arrangement coupled to the outputs of the first and second voltage followers such that a first current sourced from an output of one of the voltage followers is in proportion to a second current sourced into an output of the other of the voltage followers; and,
    iii) a wireless interface for allowing the processor to communicate with another device.

14. The system of claim 13 further comprising a display unit.

15. The system of claim 13, wherein the first voltage follower is a p-type voltage follower, and wherein the second voltage follower is an n-type voltage follower.

\* \* \* \* \*